(12) United States Patent
Clar et al.

(10) Patent No.: US 7,242,843 B2
(45) Date of Patent: Jul. 10, 2007

(54) EXTENDED LIFETIME EXCIMER LASER OPTICS

(75) Inventors: Colleen R. Clar, Victor, NY (US); Matthew J. Dejneka, Corning, NY (US); Robert L. Maier, Ontario, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 43 days.

(21) Appl. No.: 11/173,455

(22) Filed: Jun. 30, 2005

(65) Prior Publication Data

US 2007/0003208 A1   Jan. 4, 2007

(51) Int. Cl.
*G02B 6/00* (2006.01)
*G03B 27/00* (2006.01)

(52) U.S. Cl. .......................................... 385/147; 355/1

(58) Field of Classification Search ................ None
See application file for complete search history.

(56) References Cited

U.S. PATENT DOCUMENTS

| | | | |
|---|---|---|---|
| 6,466,365 B1 | 10/2002 | Maier et al. ............... | 359/355 |
| 6,833,949 B2 | 12/2004 | Maier et al. ............... | 359/355 |
| 6,872,479 B2 | 3/2005 | Maier et al. ............... | 428/696 |
| 6,911,283 B1* | 6/2005 | Gordon et al. ............... | 430/5 |

OTHER PUBLICATIONS

"Recent results on EUV Mask Blank Multilayers and Absorbers" Sietz, et al Emerging Lithographic Technologies IX Proceedings of SPIE vol. 5751 190-199.

"Aggregation and Flow of Solids" Beilby, et al, MacMillan and Co. Lmtd. 1921 pp. 106-115.

"Development of Low-loss optical coatings for 157nm lithography"R. Biro, et al Optical Micolithography XV, Proceedings of SPIE vol. 4691 2002 pp. 1625-1634.

"Hyper-numbertical aperature imaging challenges for 193nm" Optical Microlithography XVIII, Proceedings of SPIE vol. 5754 pp. 69-79.

"Improvement of the lifetime of the optical coatings under high power laser irradiations" Optical Microlithography XVIII, Proceedings of SPIE vol. 5754 pp. 1304-1311.

"Surface characterization of Optically Polished $CaF_2$ crystal by quasi-Brewster Angle Technique", Jue Wang, et al, Proceedings of SPIE vol. 5188 pp. 106-114.

"Ambient Effects on the Laser Durability of 157 nm Optical Coatings", V. Liberman, et al, Optical Micorlithography XVI Proceedings of SPIE vol. 5040 2003 pp. 487-498.

"hetero-opitaxial growth and optical properties of $LaF_3$ on $CaF_2$" Taki, et al Thin Solid Films, 420-421 (2002) 30-37.

*Prism and Lens Making*, F. Twyman, F.R.S., Hilger & Watts. LTD London $2^{nd}$ Edition, pp. 53-65.

* cited by examiner

*Primary Examiner*—Tina M. Wong
(74) *Attorney, Agent, or Firm*—Walter M. Douglas

(57) ABSTRACT

The invention is directed to hermetically sealed optical lithography components or elements that are hermetically sealed by a durable coat of a hermetically sealing material selected from the group consisting of oxide and fluorinated oxide films. The durable coating of the hermetically sealing material is applied to one of more faces of the optical element, either directly to the face of the element or over a selected coating (for example, an anti-reflective coating) that has been applied to the element. The invention is further directed to a method of making hermetically sealed optical elements.

10 Claims, 6 Drawing Sheets

EXTENDED LIFETIME EXCIMER LASER OPTICS

FIELD OF THE INVENTION

The invention relates excimer laser optical components with extended lifetimes, and in particular to optics that are hermetically sealed by application of a protective coating so that they can be used in immersion lithographic methods

BACKGROUND OF THE INVENTION

As a result of damage to the surface of the optical components of the powerful excimer lasers that operate at 248 nm, 193 nm, and 157 nm and are used for optical lithography, medical and industrial applications, the lasers must either operate at power levels lower than their maximum or shorter optical component lifetimes must be accepted if the lasers are operated at higher powers levels. For excimer laser optical components, metal-fluoride optical crystals of $MgF_2$, $BaF_2$ and particularly $CaF_2$ are preferred materials due to their excellent optical properties and high band gap energies. Oxide materials are not a good choice for optical components because they are either too absorbing or they have low band gap energies, and are therefore vulnerable to color center formation when subjected to wavelengths below 200 nm. In addition, oxide materials such as high purity fused silicon dioxide have also been shown to be subject to material compaction at short wavelengths below 200 nm.

Various excimer laser components may require anti-reflection, mirror or partial mirror coatings. These coating materials are typically placed on the optical components using vacuum deposition techniques; and the materials used for such coating are also made of metal-fluoride materials. Examples of the materials used for such coating include AlF3, NaF, $MgF_2$, $LaF_3$, $GdF_3$, and $NdF_3$ among others. These optical coatings are generally considered to be the weakest links or component features in the laser systems due to the fragile and porous nature of depositions. As a result, the optics and coatings are typically used in operation in an atmosphere nitrogen purge gas to minimize problems from atmospheric contaminants as well as atmospheric absorbance in the beam path. However, even in well purged environments metal-fluoride optical coatings have been shown to degrade [See V. Liberman et al., "Ambient effects on the laser durability of 157-nm optical coatings," SPIE Vol. 5040, (2003) pp. 487-498] and uncoated metal-fluoride surfaces will similarly degrade, for example, by reaction with atmospheric moisture and carbon dioxide.

Laser manufacturers have attempted to minimize coating damage by using techniques as leaving the optical component's surfaces uncoated and/or tilting the surfaces to steep angles in order to spread the pulse energy over a larger surface area. However, while these techniques have provided some improvements, the improvements are small and insufficient to appreciable extend the lifetime of the optical components. Research by the present inventors and others [30$^{th}$ International Symposium on Microlithography, Session 12, Paper 5754-62, L. Parthier, *ArF Immersion Lithozraphy: a new challenge for CaF2 quality* (presented, but unpublished in Proc. SPIE, Vol. 5754 (2005)] have confirmed that even uncoated $CaF_2$ surfaces degrade after only a few million pulses when subjected to pulse energies above ~40 mJ/cm$^2$ using 193 nm excimer radiation. ArF excimer lasers (193 nm) typically operate at average pulse energies 15-20 mJ/cm$^2$. However, local non-uniformities in the beam profile are 2-3 times the average value, thus exceeding the ~40 mJ/cm$^2$ threshold for damage on-set. The present inventors believe that the damage begins at these local hot spots and then progresses rapidly in the surrounding areas.

Maier et al, have offered solutions as disclosed in U.S. Pat. Nos. 6,466,365, 6,833,949 and 6,827,479 that have significantly extended optical component lifetimes and have allowed laser operation at increased power levels. While the solutions disclosed in the foregoing patents have resulted in a significant extension of optical component lifetime, changes in the optical lithography area require even additional improvements. For example, laser systems operating at 4 KHz, and even 6 KHz, have become available. These systems offer the potential for even higher operating power levels. Furthermore, a new method, immersion lithography, has recently shown great promise [Webb et al. (Corning-Tropel), "Hyper-numerical aperture imaging challenges for 193 nm", SPIE Proc. Vol. 5754 (2005), pp. 69-79]. Immersion allows higher numerical apertures, resulting in increased resolution, but it also requires that the final element of the objective lens operate immersed in highly purified de-ionized ("DI") water. Since the immersed element also represents the highest energy density in the system, it must be manufactured from a metal-fluoride crystal in order to avoid the problems encountered with high purity fused silicon dioxide noted above. Metal-fluoride crystals, especially $CaF_2$ crystals, and the metal-fluoride optical coatings which may be present, are slightly soluble in highly purified DI water. This solubility leads to surface degradation, and hence to short useful lifetimes in immersed lithographic applications. Furthermore, even the presence of small amounts of water vapor and/or carbon dioxide as may be present in nitrogen purged environments can greatly accelerate the degradation of metal fluoride crystal optics. Using calcium fluoride as an example, the following equations represent the reactions that can occur.

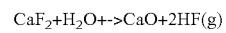

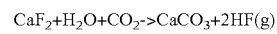

Similarly, chemical reactions are also possible between water and carbon dioxide and the fluoride materials used for the optical coatings. Regarding immersion optics (for example, a lens), one surface of the lens will be bathed in liquid water which can also contain dissolved $CO_2$ from the atmosphere. For example, $LaF_3$ films are easily oxidized and hydrolyzed forming La—O and La—OH on exposed surfaces; the problem becoming worse as the film porosity increases the surface area [see Taki et al., *Thin Solid Films*, Vol. 420 (2002), pp. 30-37].

The reaction products shown in foregoing equations absorb sub-200 nm wavelengths, which immediately leads to surface heating under irradiation, and such surface heating accelerates the pace for further surface degradation. As a result, improvements are required for metal fluoride optical elements or components that are used in immersion lithography. The invention disclosed herein prevents or severely limits the chemical reactions illustrated above and thus provides extended lifetimes for uncoated metal-fluoride substrates, and for metal-fluoride coatings, which may be present and operating in nitrogen purged environments, and for metal fluoride optical elements operating in DI water immersed configurations.

SUMMARY OF THE INVENTION

The invention is directed to hermetically sealed optical lithography components or element that are hermetically sealed by a durable coat of a hermetically sealing material selected from the groups consisting of oxide and fluorinated oxide films, said durable coating being applied to said substrate, or to selected coatings on said substrate. The hermetically sealing material can be applied directly to the substrate or to a substrate having one or a plurality of selected coating materials deposited thereon, the selected coating materials then being present between the substrate and the hermetic sealing material. Coating materials can also be applied on top of the hermetic sealing material as desired to achieve a specific purpose such as reducing reflectivity. A sealing agent, preferably a hermetic sealing agent, is applied to the perimeter area of said hermetic sealing material and said substrate such that said sealing agent is in contact with both said substrate and said sealing material.

The invention is further directed to an optical element suitable for photolithographic systems operating below 250 nm, including immersion photolithographic methods, said element comprising:

a substrate that transmits electromagnetic radiation having wavelengths below 250 nm, said substrate having a first or top face and a second or bottom face, said electromagnetic radiation entering said second face, passing through said element and exiting said first face;

optionally, one or a plurality of coating layers deposited on at least one of said first and second faces selected from the group consisting of anti-reflective coating, reflective or partially reflective mirror coatings, polarization coating, beam-splitter coating and other coating known in the art deposited on said substrate;

a dense, durable coating of a hermetic sealing material deposited on at least one of said first and second faces, said layer being deposited over said optional layers when they are present; and optionally, a sealing agent applied to the perimeter area of said hermetic sealing material and said substrate such that said sealing agent is in contact with both said substrate and said hermetic sealing material.

The invention is further directed to a method for making hermetically sealed optical lithography components or elements in which a substrate is hermetically sealed by a durable coat of a hermetically sealing material selected from the groups consisting of oxide and fluorinated oxide films. The durable coating can be applied directly to the substrate or it can be applied to a substrate that already has selected coatings, for example, anti-reflective coating, on the substrate.

The invention is additionally directed to a method of making an optical element suitable for photolithographic systems operating below 250 nm, including immersion photolithographic methods, said method is one of:

providing a metal fluoride substrate that transmits electromagnetic radiation having wavelengths below 250 nm, said substrate having a first face and a second face, and said electromagnetic radiation entering said second face, passing through said element and exiting said first face;

providing, optionally, one or a plurality of coating layers deposited on at least one of said first and second faces selected from the group consisting of anti-reflective coating, reflective or partially reflective mirror coatings, polarization coating, beam-splitter coating and other coating known in the art deposited on said substrate;

providing a dense, durable coating of a hermetic sealing material deposited on at least one of said first and second faces, said layer being deposited over said optional layers when they are present; and optionally, applying a sealing agent to the perimeter area of said hermetic sealing material and said substrate such that said sealing agent is in contact with both said substrate and said hermetic sealing material.

DETAILED DESCRIPTION OF THE INVENTION

As used herein, the term "hermetic sealing material(s)", means a substance that is applied to the top and/or bottom faces or surfaces of an optical substrate or element, or to the surface of any coating applied to the top and/or bottom face(s) of an optical element, to form a durable hermetic coating or film that protects the surface of the element, including any coating lying between the hermetic sealing material and the surface of the optical element, to prevent contact of the surface and/or coating with air, moisture and other substances. As used herein the term "sealing agent" and "hermetic sealing agent" means substance that are applied to the perimeter that exists between the hermetic sealing material and the substrate, including the layers of any coating materials that may lie between the hermetic sealing material and the substrate, in order to seal the perimeter as is exemplified in FIGS. 1B and 1C.

The invention is directed to hermetically sealed non-durable optical elements, and elements with non-durable optical coatings, with a durable a hermetic coating or film to prevent transmission degradation of the optical element and greatly extend the lifetime and value of the optic. The invention is further directed to a process for making such elements by applying a durable coating or film to the surface of a non-durable optical element, or an element with a non-durable coating thereon. The durable coating materials are selected from the group consisting of aluminum oxide ($Al_2O_3$), silicon dioxide ($SiO_2$) and fluorinated (fluorine-doped) silicon dioxide($F:SiO_2$). While the oxide based coatings may not be as highly transparent or as compaction-free as the optical elements they protect, they have a very short path length which permits their use, and which can also provide optical functionality such as becoming integral to the design of anti-reflection coatings and laser output couplers.

Figure 1A:
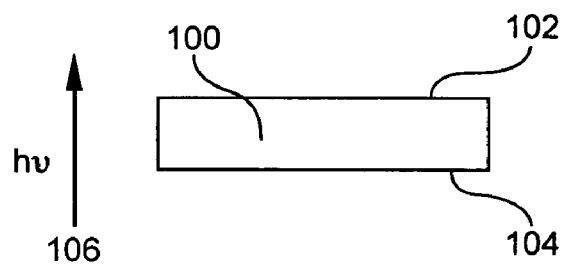
FIG. 1A illustrates an optical substrate 100 suitable for optical lithography, including immersion lithography.

FIG. 1A illustrates an optical element substrate 100 having a thickness (not numbered) that is suitable for optical lithography, including immersion lithography, which has a first or top face 102 and a second or bottom face 104. Electromagnetic radiation hv, for example, laser light, traveling in the direction indicated by arrow 106 (shown in FIGS. 1B and 1C) strikes second face 104 of substrate 100, passes through the thickness of the substrate and exits the first face 102. In immersion lithography face 102 would be in directed contact with a fluid, for example, water, if it was not coated with a hermetic coating according to the invention. The substrate can be made of any material suitable for optical lithography, including HPFS™ (Corning Incorporated) and metal fluorides. For immersion lithography lasers operating below 250 nm and particularly below 200 nm, the preferred substrate material is a single crystal of an alkaline earth metal fluoride ($MgF_2$, $CaF_2$, $BaF_2$ and $SrF_2$) or a mixture of alkaline earth metal fluorides (e.g., $CaSrF_2$). The preferred metal fluoride is $CaF_2$.

Figure 1B:
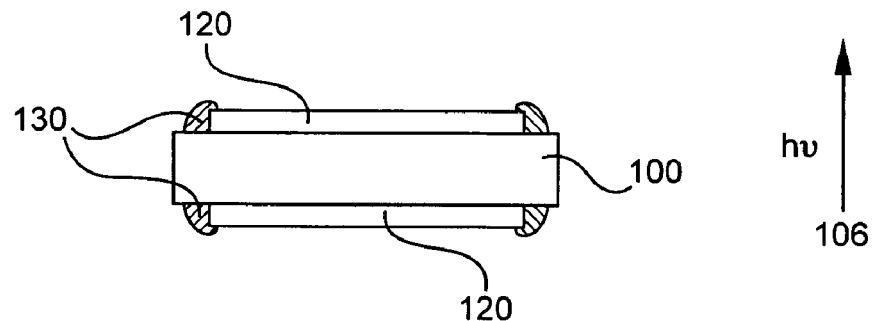
FIG. 1B illustrates a hermetically coated optical component according to the invention that is suitable for optical lithography, including immersion lithography, in which both faces of the element are coated with a hermetic sealing material.
Figure 1C:
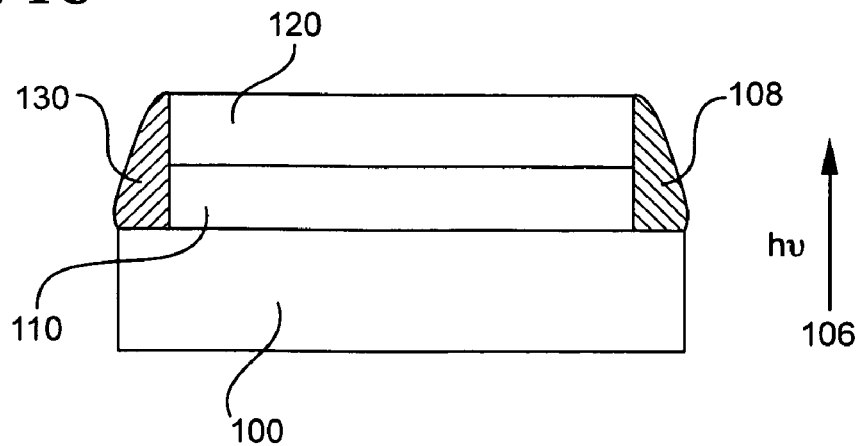
FIG. 1C illustrates a hermetically coated optical component according to the invention that is suitable for optical lithography, including immersion lithography, in one face has an optional coating over which the hermetic sealing material is applied.

FIG. 1B illustrates an embodiment of the present invention in which a hermetic sealing material 120 has been applied to the first and second faces of substrate 100. In addition a sealing agent 130 is applied along the perimeter of the hermetic sealing material and the substrate to thereby seal the edge. In an alternate embodiment the hermetic sealing material and the sealing agent are applied only to the first face, the face that will be in contact with a fluid when the element is used in immersion lithography. When layers of optional coating materials are applied to the substrate before the deposition of the hermetic sealing material, the sealing agent is applied as illustrated in FIG. 1C. Sealing agents include epoxy materials (particularly materials that are heat stable to temperatures of up to approximately 300° C. as well as water resistant), and metal films (Ni, Cr, Ni/Cr, Al and others known in the art), and dielectric and other materials ($Al_2O_3$, $SiO_2$, F-doped $SiO_2$, $TiO_2$, $SrF_2$, $MgF_2$, Si, Ge, and others known in the art). The metal and the dielectric and other materials described above, and similar materials known in the art, can be viewed as hermetic sealing agents and can be deposited by sputtering, atomic vapor deposition, and other methods known in the art [for example, as described in commonly owned U.S. provisional application Ser. No. 60/696,314, filed Jun. 30, 2005, Express Mail No. EV327192466US, for "Hermetic Seals for Micro-Electromechanical System Devices, whose teaching are incorporated herein by reference, describing methods and hermetic sealing agents (for example, $Al_2O_3$, $SiO_2$, and F-doped $SiO_2$ among others) that can be used for hermetically sealing the edge of the hermetic sealing material 120 and the substrate 100 (including the coatings 110) of the present invention]. Additionally, after an optical element having a hermetic sealing material deposited thereon has been prepared in accordance with the present invention, with or without the application of optional coating and/or optional sealing agent, the element can be placed in a holder for use in a laser lithographic system. When the element is placed in the holder, a gasket (for example, a gasket of indium, rubber or other material known in the art) can be placed between the perimeter of the elements and the holder.

FIG. 1C illustrates an embodiment of the invention in which one or a plurality of optional coatings 110 is applied between the hermetic sealing material 120 and the substrate 100. When the optional coating(s) 110 are present, the sealing agent 130 is applied along the perimeter between the sealing material 120 and the substrate 100, thus further sealing the coating(s) 110 layer as well. While FIG. 1C illustrates only the first or top face of the substrate having optional coating(s) 110 and hermetic sealing material layer 120, both the top and the second or bottom face of substrate 100 can have the both the hermetic sealing material layer 120 and the coating(s) layer 110. Alternatively, the second face can have only the hermetic sealing layer 120. In yet another embodiment the first face can have only the hermetic sealing material layer 120 and the second face can have both the hermetic sealing layer 120 and the optional coating(s) 110 layer. The optional coating(s) can be any known in the art; for example without limitation, anti-reflective coating(s) (for example without limitation, $MgF_2$, $SiO2$, $ZrO_2$, $Al_2O_3$ and $Y_2O_3$ and other materials known in the art) and partially reflective mirror coatings (for example without limitation, aluminum, silver and others materials known in the art; and dielectric layer combinations of $MgF_2$, $SiO2$, $ZrO_2$, $Al_2O_3$ and $Y_2O_3$ and other materials known in the art).

According to research resulting in the present invention, significant surface heating results when high energy excimer lasers are used with optically polished metal-fluoride optical components. This heating becoming more troublesome as pulse rates increase and results in damage to the optical element. The heating results from the absorption of radiation by contaminants residing in the polishing layer (the "Bielby" layer; see F. Twyman, *Prism and Lens Making*, $2^{nd}$ Ed., (Hilger & Watts, Ltd., London 1957), pages 53-56; and G. Bielby, *Aggregation and Flow of Solids*, (Macmillan, London 1921), pages 106-111) or in the subsurface fractures created during the first stages of optical fabrication (sawing and grinding) of elements. Small concentrations of water vapor and surface heating are necessary and sufficient conditions to permit thermo-chemical reactions to take place (see FIG. 2 and FIG. 3) that produce surface damage, according to the equations:

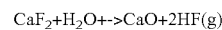

$$CaF_2+H_2O+\rightarrow CaO+2HF(g)$$

$$\text{and } CaF_2+H_2O+CO_2\rightarrow CaCO_3+2HF(g)$$

Once these reactions have begun, additional absorption products appear on surfaces, thus driving the surface temperature even higher. As excimer lasers are pushed to higher repetition rates (2 KHz->4 KHz->6 KHx), heating becomes more severe, the element's temperatures saturate at a higher levels, the time constant for temperature saturation is shortened, and the thermo-chemical reaction time and temperature thresholds are lowered. According to the present invention, thin films of selected dielectric materials are deposited on the surface of a metal fluoride optical element substrate that can be coated or uncoated, for example with anti-reflective coatings, to hermetically seal metal fluoride optical surfaces and prevent such chemical reactions from taking place.

Figure 3:
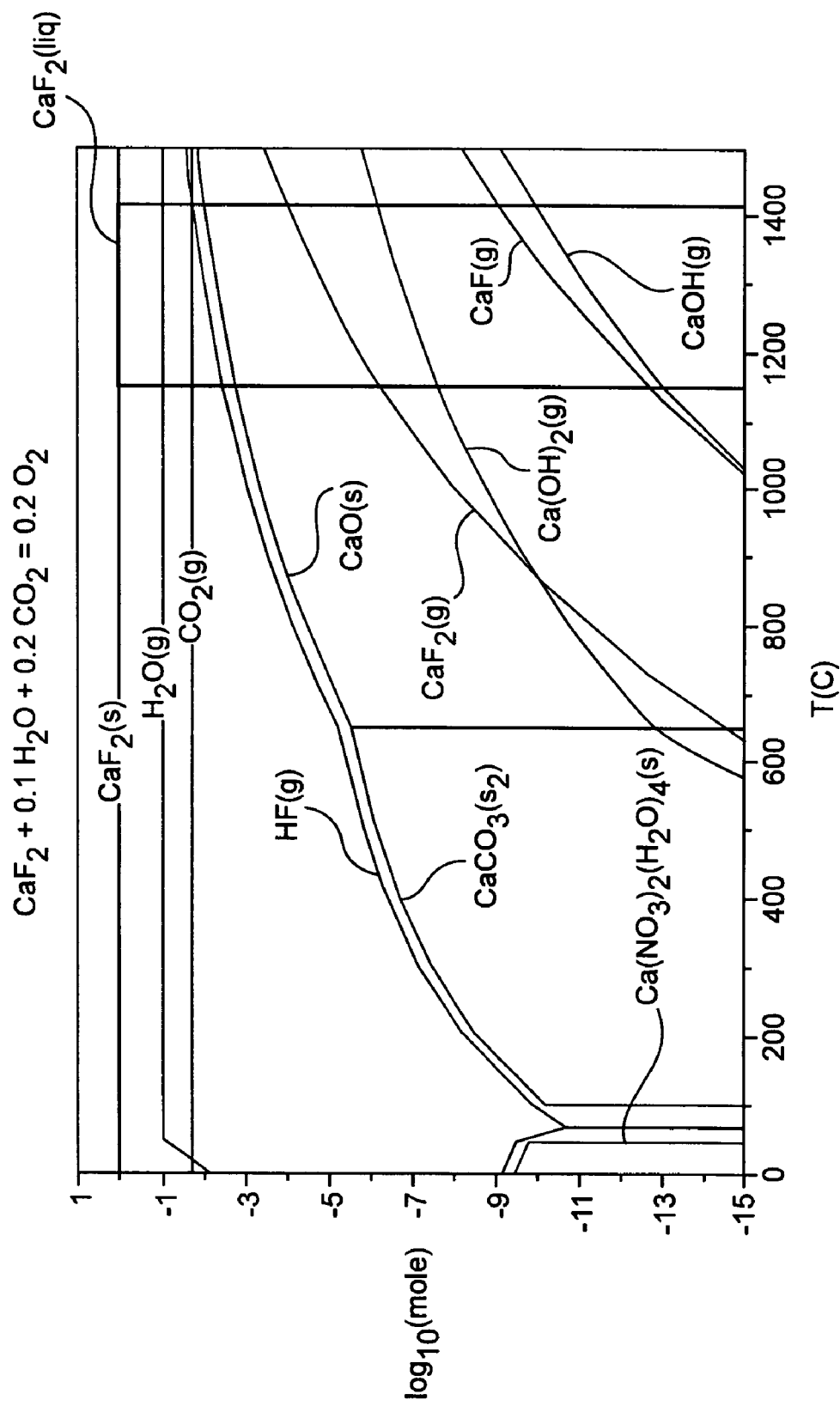
FIG. 3 is a graph illustrating the calculated equilibrium products of $CaF_2$ in humid air containing $CO_2$.
Figure 4:
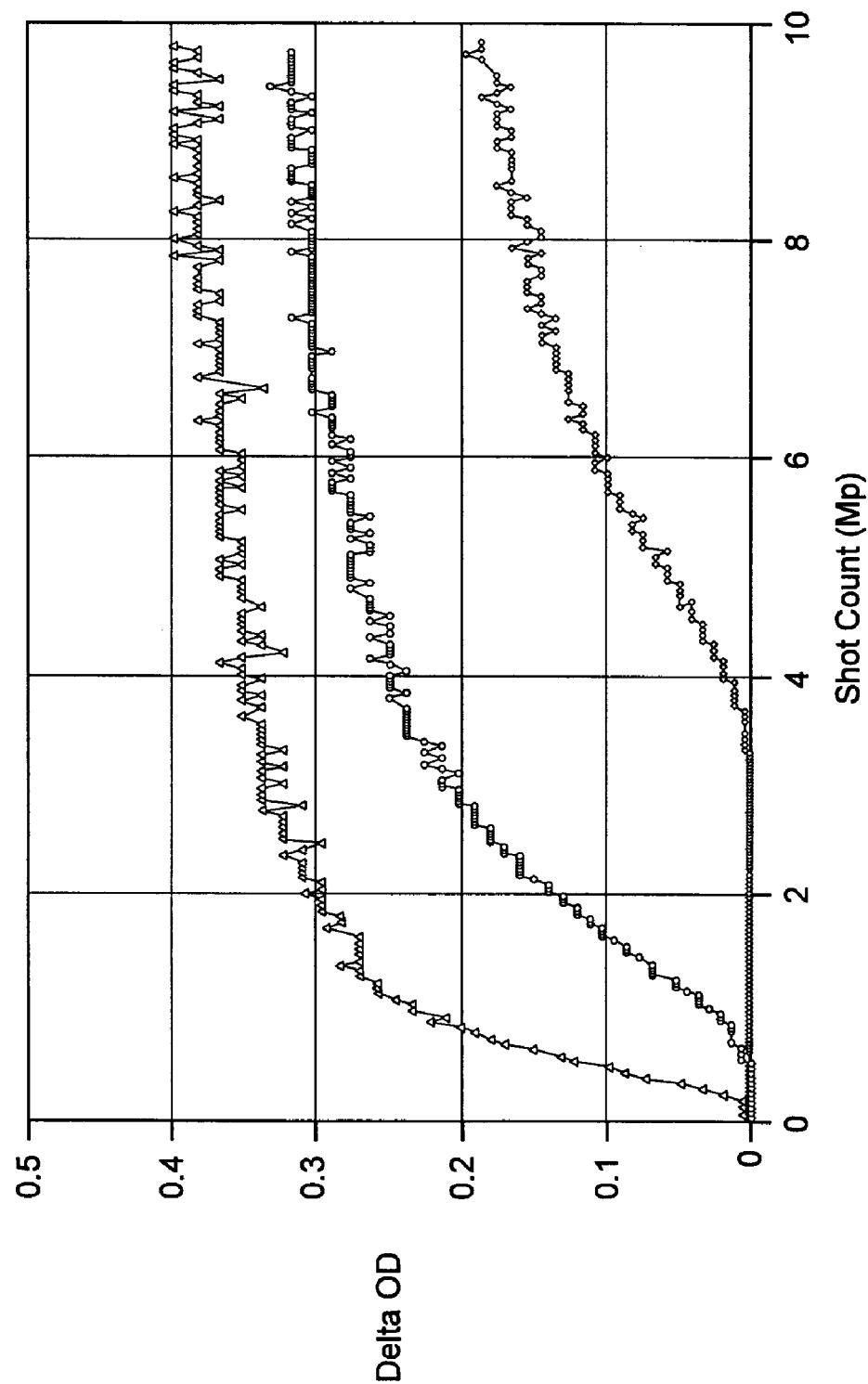
FIG. 4 is a graph illustrating the increase in optical density of an uncoated $CaF_2$ optical component versus shot (pulse) count as a function of the moisture present in the component's atmosphere.

FIG. 3 illustrates the increase in absorption with shot count for a $CaF_2$ (111) surface under 193 nm radiation at 2 KHz and 63 mj/cm² pulse energy, for various conditions of purge gas. As shown in FIG. 3 the role of water vapor is dominant for determining component lifetime. FIG. 4 illustrates $CaF_2$ (111) component lifetime is extended even for a 50% increase in repetition rate, and 50% increase in pulse energy, when the optic (i.e., optical element) is protected according to our inventions.

Figure 5:
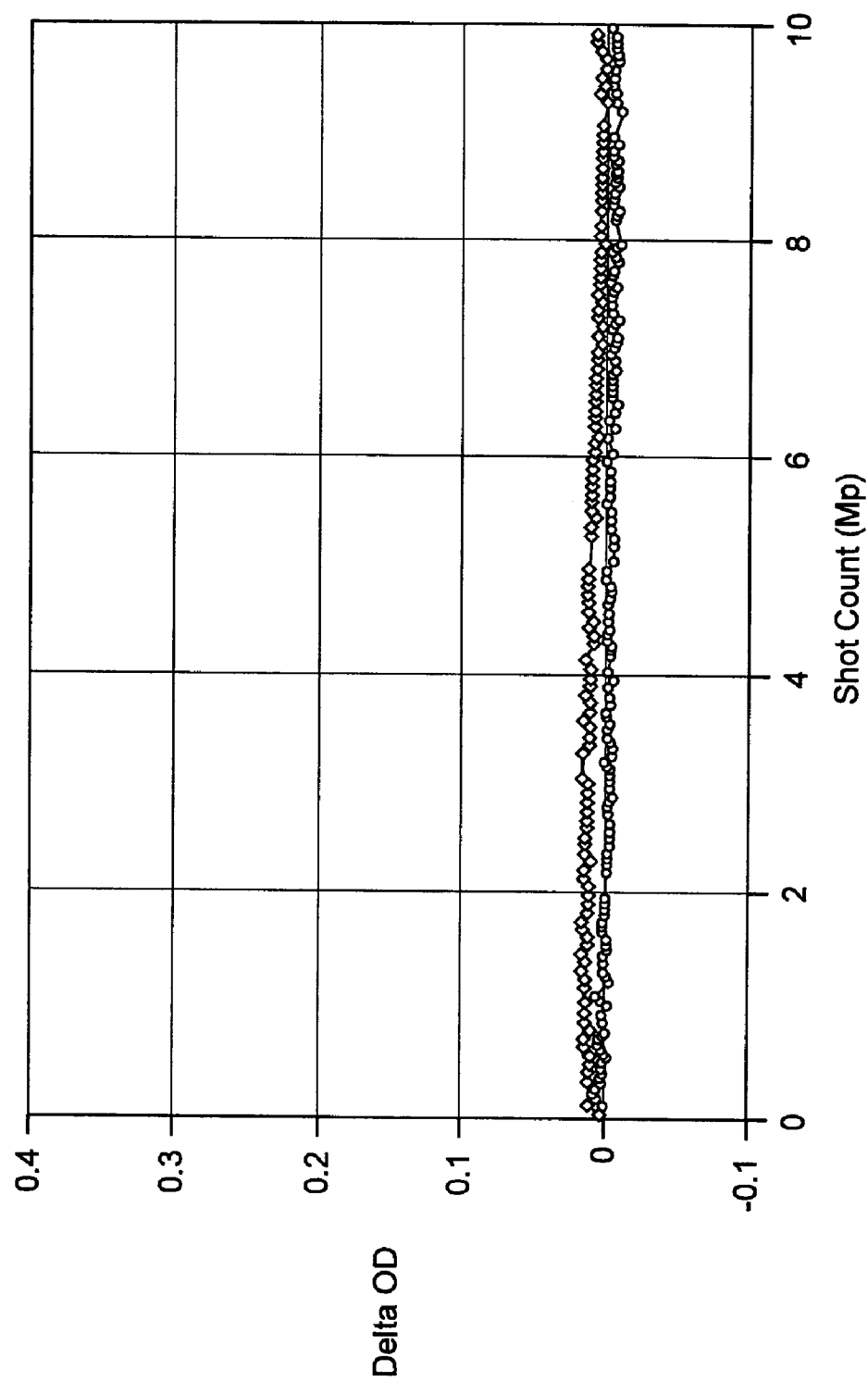
FIG. 5 is a graph illustrating, in comparison to FIG. 4, unchanging optical density versus shot (pulse) count as function of moisture present in the component's atmosphere.
Figure 6:
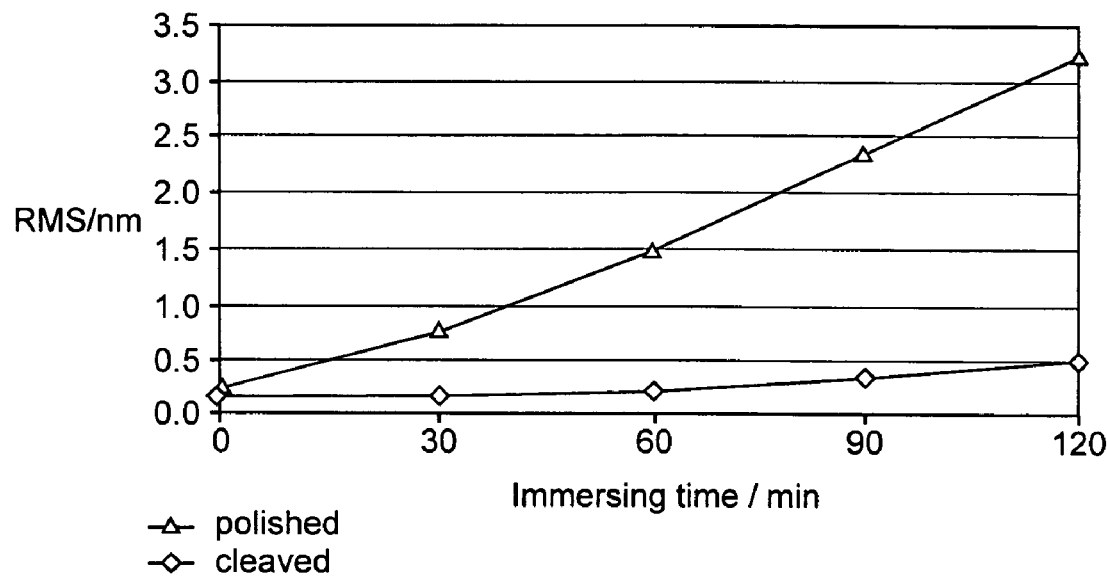
FIG. 6 is a graph illustrating the surface degradation of an unprotected $CaF_2$ surface after distilled water soaking.
Figure 7:
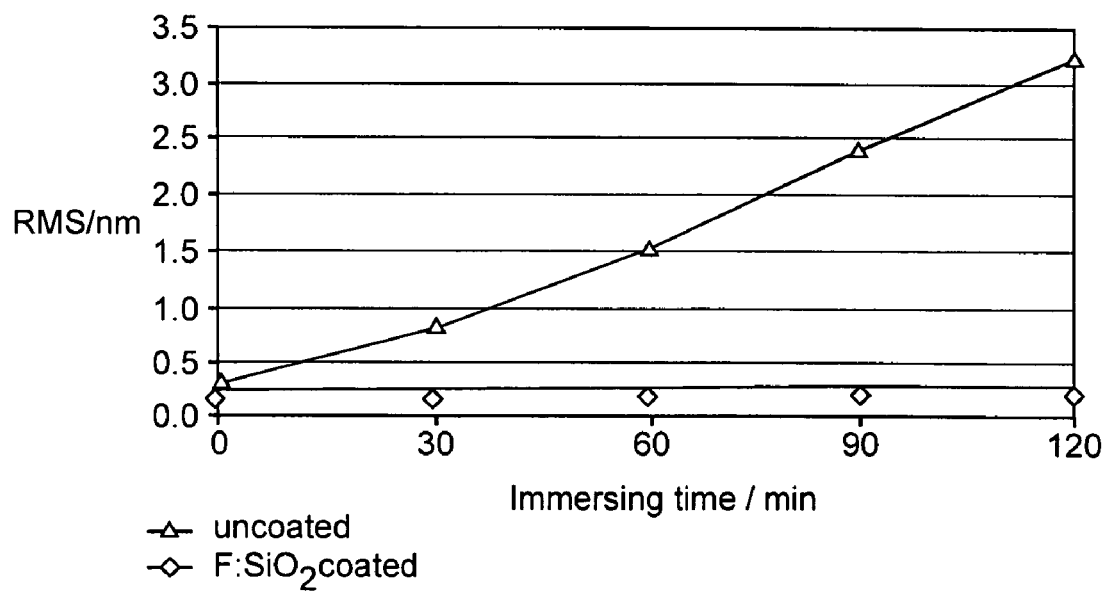
FIG. 7 is a graph illustrating the surface degradation of unprotected polished $CaF_2$ surface after distilled water soaking verses a surface protected according to the invention.

For immersion lithography, the final CaF$_2$ projection lens element must be in direct contact with deionized water ("DI" water) during irradiation. As shown in FIG. 5, immersing an uncoated CaF$_2$ surface in DI water for 2 hours results in 10-fold increase of surface root-mean-square (RMS) roughness. it has also been determined that the surface RMS evolution of uncoated CaF$_2$ elements in DI water is strongly related to surface finishing quality, including the thickness of the precipitated layer from polishing, and the depth of subsurface damage [J. Wang et al., "Surface characterization of optically polished CaF$_2$ crystal by quasi-Brewster angle technique", SPIE Proc., Vol. 5188 (2003), pages 106-114; and J. Wang et al., "Quasi-Brewster angle technique for evaluating the quality of optical surfaces", SPIE Proc., Vol. 5375 (2004) pages 1286-1294]. Even for cleaved but uncoated CaF2 (111) surfaces, degradation has also been observed as shown in FIG. 6. FIG. 7 shows how a polished CaF2 (111) optic, protected according to our inventions, resists attach from DI water soaking as compared to a similar unprotected optic.

Figure 2:
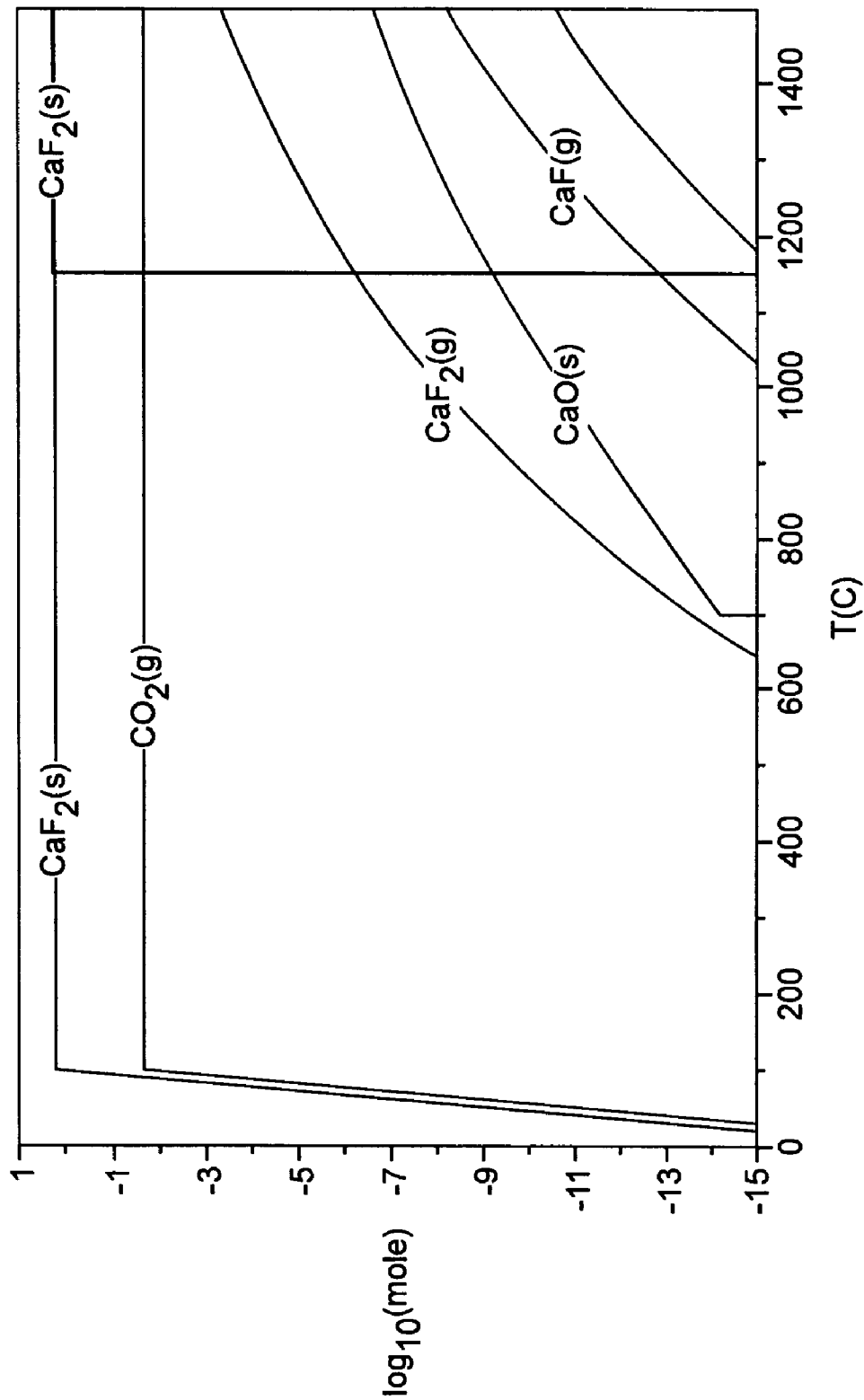
FIG. 2 is a graph illustrating the calculated equilibrium products of $CaF_2$ in dry air containing $CO_2$.

In accordance with the invention, advanced plasma processes were used to apply dense depositions of silicon dioxide, aluminum oxide or, preferably, fluorinated silicon dioxide to metal-fluoride optical surfaces. Such depositions, when applied according to our inventions, provide a hermetic seal, thus preventing moisture or other contaminants from reaching the polished surface of the metal-fluoride substrate. Thermodynamic models predict the formation of small amounts of carbonates, hydroxides, and oxides. Such reactions typically begin above 600° C. However, in the presence of small amounts of water vapor, these reaction temperatures are lowered to 50° C. to 100° C. as shown in FIGS. 2 and 3. In addition, the UV energy from the laser beam provides additional activation energy which can initiate these reactions at ambient temperatures and create very aggressive transient compounds and radicals such as ozone. Optical coatings composed of metal-fluoride materials can be similarly damaged by small amounts of water vapor such as can be found even in well purged nitrogen environments. While these optical coatings can also be similarly encapsulated by dense hermetic films of oxide materials, the dense films used for hermetic sealing must be included into the thin film coating design. Our models predict, and our research has shown, that certain metal-fluoride coatings can be damaged by similar thermo-chemical reactions between rare earth fluoride materials and either silicon dioxide or fluorinated silicon dioxide films. Once again the reaction temperatures necessary to drive these reactions can be dramatically lowered by the presence of a few ppm of water vapor. Thus, in thin film stack design, it is very important to physically separate layers that can chemically react with each other to prevent device failure. Solutions of the present invention to the problems encountered with immersion optics include:

(1) Drying the metal fluoride optic by either heating or purging in a very dry atmosphere, preferably in vacuum. The optic is then placed in a holder that holds it along two or more edges. The use of the holder results in the formation of the substrate 100 uncoated "lip" 108 as shown in FIG. 1C. The sealing agent 130 adheres to substrate 100 at the lip 108 and also adheres to hermetic sealing material 120 and coating(s) 110.

(2) Using an advanced plasma deposition process (processing parameters previously described in U.S. Pat. Nos. 6,466,365, 6,833,949 and 6,872,479) to deposit dense films (hermetic layer) of aluminum oxide, silicon dioxide or preferably fluorinated silicon dioxide, directly onto the dried metal fluoride substrate to hermetically seal the surface. Fluorinated silicon dioxide is preferred.

(3) After application of the hermetic layer as in (2), additional layers of metal fluoride films may optionally be applied to yield anti-reflection ("AR") properties, partial reflection properties, mirror coatings, beam splitter coatings, polarization control coatings, and other coating as are known in the art. (In general, rare earth tri-fluorides have higher indices of refraction, while non-rare earths have low indices of refraction. Layers are represented in thin film designs by H, L or M, for high index QWOT, low index QWOT, or medium index QWOT, where QWOT means quarter wave optical thickness, and optical thickness is optical index multiplied by physical thickness of a layer. Therefore, materials representing H would be the rare earth tri-fluorides NdF$_3$, LaF$_3$, and GdF$_3$, all of which have an index of refraction ~1.73 at 193 nm. L would be represented by MgF$_2$, AlF$_3$ and BaF$_2$, all of which have indices ~1.45. M would be DyF$_3$ and YF$_3$, with indices ~1.62. However, these last two are not particularly useful due to their indices which are too low to be high, and too high to be low. A typical AR construction might be: CaF$_2$ substrate, then HL 2Q nitrogen where 2Q would be 2 QWOT's or a half wave of F:SiO$_2$. Half waves are absent at the wavelength of interest, so this layer can be put down without upsetting the AR efficiency, but it provides the hermetic barrier. An output coupler might be CaF$_2$ HLHLH nitrogen. However, this does currently present a problem. We'd like to put down the 2Q hermetic layer, but at would put a rare earth next to fluorinated silicon dioxide, so instead we add 2L then 2Q, making the final design CaF$_2$ HLHLH 2L 2Q nitrogen. This deposition pattern achieves (a) the desired reflectivity, (b) the hermetic sealing layer, and (c) the rare-earth fluoride-oxide barrier layer separation, etc.)

(4) As in (3) above except that the metal fluoride layer next to the hermetic seal layer (Al2O3, SiO2, or F:SiO2) is not a rare earth metal-fluoride, such as LaF3, GdF3, NdF3, but rather non-rare earth metal fluoride material such as NaF, AlF3, or MgF2. (Note: Item (2) above is meant to include any combination of rare earth and non-rare earth layers as described provided that the rare earth layer does not tough the oxide layers.)

(5) A final top layer of Al$_2$O$_3$, SiO$_2$ or F:SiO$_2$ is applied to encapsulate the underlying metal fluoride multi-layer combination, being careful not to place a rare earth metal-fluoride layer next to the top encapsulating layer. F:SiO$_2$ is preferred top layer material.

(6) As in (5) except where the first oxide layer next to the substrate is omitted and the optional coating of (2) is applied directly to the metal fluoride substrate.

(7) A dense layer of Al$_2$O$_3$, SiO$_2$ or F:SiO$_2$ to hermetically seal the metal fluoride optic from DI water degradation in immersed lithographic applications. F:SiO$_2$ is preferred material. This also relates to the (6) where the "optional coating" is applied to the metal fluoride substrate and then the dense film is applied as here in (7)

(8) A hermetic layer as in (7) above which in addition becomes part of a thin film design for anti-reflecting the metal-fluoride to DI water interface, or for polarization control at steep incidence angles as are common for immersed applications.

(9) An optic with hermetic sealing layer(s) as described above, which in addition has a hermetic compound applied around the edges of the hermetic dense film layer to seal the coating to the substrate, as shown in FIG. 1.

By slowing or completely preventing water vapor from contact with the metal fluoride optic, thermo-chemical reactions are slowed or completely prevented from taking place. Such reactions, once begun, lead to a rapid degradation of the surface. Optic surfaces protected by a dense hermetic layer according to the invention allow laser components to have a longer lifetime (greater pulse count). Consequently, there is less down time for component change over and lower overall costs because components are changed less frequently. Reduced down time is a critical measure for lithographic systems which cost $5 MM-$10 MM and run around the clock in semi-conductor fabrication facilities. In addition, the use of the hermetic seals enables the use of higher laser power, which in turn means shorter exposure times, hence more wafers per hour put through the microlithographic fabrication process which is also a critical measure for semi-conductor manufacturers. Finally, the present invention enables an entirely new generation of lithography methods because currently due to $CaF_2$ optic degradation in DI water (immersion), 193 nm immersion technology is simply not viable at using lasers at their present levels. (While there exist some lower power systems that use a silicon dioxide element as the bottom element immersed in water, the use of such elements is limited because of the formation of color centers as explained above. For production purposes, the desire is for higher through-put, and this means that higher power and consequently the use of $CaF_2$ immersion elements.)

The research involving the present invention indicates that laser damage to metal fluoride optical components, for example, components made of $CaF_2$, is caused by a combination of surface heating together in the presence of small amounts of water vapor. It has been found that as little as a few ppm of water, which may, for example, be present in a purge gas, is enough to trigger thermo-chemical reactions resulting in absorbing reaction products which further increase the temperature and hence accelerate the degradation process. The initial surface heating is produced when laser energy exceeding about 40 mJ/cm2 is absorbed by surface or subsurface contaminants remaining from optical finishing and/or cleaning of the optical surface. According to the present invention optical surfaces can be protected from such damage by hermetically sealing a well prepared surface using dense depositions of oxide materials carried out in a vacuum process as is described below.

The success of the process described herein is enhanced by a well polished metal fluoride substrate surface; that is, a surface with sub-surface damage extending into a crystal for a distance of less than 600 nm, and a surface micro roughness less than 0.5 nm as measured by AFM (atomic force microscope) methods. The surface must also be clean and dry to prevent contaminants such as hydroxyls from being trapped under the hermetic layer. As an example, an optic is first cleaned by traditional methods such as are commonly known to those skilled in the art; for example, manually cleaning using a mild detergent, followed by thorough rinsing in DI water, and then further followed by an alcohol bath using manual drying. After the initial cleaning any remaining organic contaminants can be further removed using ultraviolet-ozone cleaning, though this is not always necessary. The optics are then loaded into the vacuum chamber. The chamber is evacuated to a pressure of less than $5 \times 10^{-5}$ mbar, but preferably to a pressure of less than $8 \times 10^{-6}$ mbar. Optionally, a low voltage ion-plasma cleaning step may be performed within the vacuum chamber immediately before the deposition of the coating material. The foregoing cleaning steps, in particular the drying step, are utilized in order to maximize the adhesion of the coating to the optic and to minimize the possibility of trapping water under the coating of the hermetic sealing material.

Once the optical surface layer has been prepared, a hermetic sealing layer or a plurality of layers, are deposited at near bulk densities, according to methods and parameters described in the commonly assigned U.S. Pat. Nos. 6,466,365, 6,833,949, and 6,872,479. The sealing layers are selected from the group of dielectric materials consisting of $Al_2O_3$, $SiO_2$ (silicon dioxide), and $F:SiO_2$ (fluorinated silicon dioxide) $F:SiO_2$ being preferred. Substrate surface temperature during deposition may be in the range of 50° C. to 300° C., preferable being approximately 120° C. The dielectric hermetic films are made from pure (99.9% or better) starting materials. In the case of fluorinated silicon dioxide, the fluorine dopant levels are in the range of 0.5 wt. % to 4.5 wt. %. Deposition rates for the dielectric material at the substrate surface are between 0.05 nm/sec and 0.6 nm/sec; the preferred rate being 0.15±0.5 nm/sec. Chamber pressure during deposition ranges between $7 \times 10^{-5}$ mbar and $4 \times 10^{-4}$ mbar, but typically is approximately $2.5 \times 10^{-4}$ mbar. The pressure in the chamber is due to the inert gas plus oxygen, which must be bled into the ion source. Bombarding ions arrive at the depositing film with ion energies in the range of 80 eV to 160 eV, but typically approximately 110 eV. These bombardment ion energy levels are more than sufficient to overcome surface energies of ~5 eV for deposited molecules, and thus provide mobility to create compact dense films. In addition, the ratio of arriving molecules to arriving ions is important to film density and film stoichiometry. While the exact details must be carefully worked out according to material being deposited, chamber geometry, deposition rates, gas flows, and other parameters selected for the ion source, these details will be understood by and within the ability of those skilled in the art when they use the teachings herein. The thickness of the deposited dielectric hermetic films is in the range of 20 nm to 200 nm; preferably in the range of 50 to 150 nm, depending somewhat on the wavelength of interest. Generally, the lower the wavelength (in the range of 157 nm to 258 nm) that is being used the thinner is the film.

Metal fluoride layer(s) are deposited similarly, except there is no ion plasma bombardment during deposition, and evaporation source can be electron gun, or preferably resistance sources, such as tungsten, molybdenum, tantalum, or most preferably platinum. Deposition rates can be from 0.02 nm/sec to about 2 nm/sec., most preferably about 0.2 nm/sec. Substrate deposition temperatures can range from 50° C. to 300° C., preferably about 250° C. However, care must be taken during the thin film design in order to avoid the placement of trifluoride materials next to the hermetic oxides layers. Such design restrictions are easily managed by those skilled in the art of thin film design.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. An optical element suitable for photolithographic systems operating below 250 nm, including immersion photolithographic methods, said element comprising:
   a substrate that transmits electromagnetic radiation having wavelengths below 250 nm, said substrate having a first or top face and a second or bottom face, said electromagnetic radiation entering said second face, passing through said element and exiting said first face;
   optionally, one or a plurality of coating layers deposited on at least one of said first and second faces selected from the group consisting of anti-reflective coating, reflective or partially reflective mirror coatings, polarization coating, beam-splitter coating and other coating known in the art deposited on said substrate;
   a dense, durable coating of a hermetic sealing material deposited on at least one of said first and second faces, said layer being deposited over said optional layers when they are present; and
   optionally a sealing agent applied to the perimeter area of said hermetic sealing material and said substrate such that said sealing agent is in contact with both said substrate and said hermetic sealing material;
   wherein the hermetic material is fluorinated silicon dioxide having a fluorine content in the range of 0.5 wt. % to 4.5 wt. %.

2. The element according to claim 1, wherein the substrate is selected from the group consisting of a low expansion glass, a high purity fused silica glass, and a single crystal of an alkaline earth metal fluoride or mixture of alkaline earth metal fluorides.

3. An optical element suitable for photolithographic systems operating below 250 nm, including immersion photolithographic methods, said element comprising:
   a metal fluoride substrate that transmits electromagnetic radiation having wavelengths below 250 nm, said substrate having a first or top face and a second or bottom face, said electromagnetic radiation entering said second face, passing through said element and exiting said first face;
   optionally, one or a plurality of coating layers deposited on at least one of said first and second faces selected from the group consisting of anti-reflective coating, reflective or partially reflective mirror coatings, polarization coating, beam-splitter coating and other coating known in the art deposited on said substrate;
   a dense, durable coating of a hermetic sealing material deposited on at least one of said first and second faces, said layer being deposited over said optional layers when they are present; and
   optionally a sealing agent applied to the perimeter area of said hermetic sealing material and said substrate such that said sealing agent is in contact with both said substrate and said hermetic sealing material;
   wherein the hermetic material is fluorinated silicon dioxide having a fluorine content in the range of 0.5 wt. % to 4.5 wt. %.

4. The element according to claim 3 wherein the optional coating materials are selected from the group consisting of rare earth metal fluorides and non-rare earth metal fluorides.

5. The element according to claim 4, wherein the optional coating materials are selected from the group consisting of $MgF_2$, $BaF_2$, $CaF_2$, $SrF_2$, $NaF$, $LiF$, $AlF_2$, $LaF_3$, $GdF_3$, $NdF_3$, $DyF_3$, $YF_3$ and $ScF_3$; except that the optional coating materials is not the same material as the substrate.

6. The element according to claim 3, wherein the substrate is calcium fluoride single crystal.

7. The element according to claim 3, wherein the optional coating materials are selected from the group consisting of $MgF_2$ $SiO_2$, $ZrO_2$, $Nb_2O_3$, $Al_2O_3$ and $Y_2O_3$.

8. The element according to claim 3, wherein said hermetic sealing material is applied to both said first and second substrate faces, and said optional coating material is applied to said first face between said substrate and said hermetic sealing material.

9. A method of making an optical element suitable for photolithographic systems operating below 250 nm, including immersion photolithographic methods, said method comprising:
   providing a metal fluoride substrate that transmits electromagnetic radiation having wavelengths below 250 nm, said substrate having a first face and a second face, and said electromagnetic radiation entering said second face, passing through said element and exiting said first face;
   providing, optionally, one or a plurality of coating layers deposited on at least one of said first and second faces selected from the group consisting of anti-reflective coating, reflective or partially reflective mirror coatings, polarization coating, beam-splitter coating and other coating known in the art deposited on said substrate;
   providing a dense, durable coating of a hermetic sealing material deposited on at least one of said first and second faces, said layer being deposited over said optional layers when they are present; and
   optionally applying a sealing agent to the perimeter area of said hermetic sealing material and said substrate such that said sealing agent is in contact with both said substrate and said hermetic sealing material;
   wherein providing a dense, durable coating of a hermetic sealing material means providing a coating of fluorinated silicon dioxide having fluorine content in the range of 0.5 wt. % to 4.5 wt. %.

10. The method according to claim 9, wherein said hermetic sealing material is deposited using an advanced plasma deposition process.

* * * * *